US007656698B1

(12) United States Patent
Poplevine et al.

(10) Patent No.: US 7,656,698 B1
(45) Date of Patent: Feb. 2, 2010

(54) NON-VOLATILE MEMORY CELL WITH IMPROVED PROGRAMMING TECHNIQUE WITH DECOUPLING PASS GATES AND EQUALIZE TRANSISTORS

(75) Inventors: Pavel Poplevine, Foster City, CA (US); Annie-Li-Keow Lum, Milpitas, CA (US); Hengyang (James) Lin, San Jose, CA (US); Andrew J. Franklin, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/656,650

(22) Filed: Jan. 23, 2007

(51) Int. Cl.
*G11C 11/00* (2006.01)

(52) U.S. Cl. .................. 365/154; 365/207; 365/196; 365/189.15; 365/218

(58) Field of Classification Search .................. 365/154, 365/207, 196, 189.15, 218
See application file for complete search history.

(56) References Cited

U.S. PATENT DOCUMENTS

| 5,198,706 | A | * | 3/1993 | Papaliolios | 326/37 |
|---|---|---|---|---|---|
| 5,646,885 | A | | 7/1997 | Matsuo et al. | 365/185.05 |
| 5,777,935 | A | * | 7/1998 | Pantelakis et al. | 365/203 |
| 6,034,909 | A | * | 3/2000 | Brady | 365/208 |
| 6,137,723 | A | | 10/2000 | Bergemont et al. | 365/185.18 |
| 6,903,978 | B1 | | 6/2005 | Mirgorodski et al. | 365/185.28 |
| 6,985,386 | B1 | | 1/2006 | Mirgorodski et al. | 365/185.05 |
| 6,992,927 | B1 | | 1/2006 | Poplevine et al. | 365/185.05 |
| 7,020,027 | B1 | | 3/2006 | Poplevine et al. | 365/185.28 |
| 7,042,763 | B1 | | 5/2006 | Mirgorodski et al. | 365/185.05 |
| 7,164,606 | B1 | | 1/2007 | Poplevine et al. | 356/185.28 |
| 7,167,392 | B1 | | 1/2007 | Poplevine et al. | 365/185.08 |
| 7,233,521 | B1 | * | 6/2007 | Mirgorodski et al. | 365/185.01 |
| 7,453,726 | B1 | * | 11/2008 | Poplevine et al. | 365/185.08 |
| 2003/0223289 | A1 | * | 12/2003 | Ganivet et al. | 365/200 |
| 2005/0207223 | A1 | * | 9/2005 | Taheri et al. | 365/185.08 |

* cited by examiner

*Primary Examiner*—Thong Q Le
(74) *Attorney, Agent, or Firm*—Dergosits & Noah LLP

(57) ABSTRACT

A 4-transistor non-volatile memory (NVM) cell includes a static random access memory (SRAM) cell structure. The NVM cell utilizes a reverse Fowler-Nordheim tunneling programming technique that, in combination with the SRAM cell structure, allows an entire array to be programmed at one cycle. Equalize transistors are utilized to obtain more uniform voltage on the floating gates after an erase operation. Utilization of decoupling pas gates during a read operation results in more charge difference on floating gates of programmed and erased cells.

9 Claims, 8 Drawing Sheets

US 7,656,698 B1

NON-VOLATILE MEMORY CELL WITH IMPROVED PROGRAMMING TECHNIQUE WITH DECOUPLING PASS GATES AND EQUALIZE TRANSISTORS

TECHNICAL FIELD

The present invention relates to integrated circuit memory devices and, in particular, to a 4-transistor non-volatile memory (NVM) cell structure that includes a static random access memory (SRAM) cell. The cell utilizes equalize transistors to obtain more uniform voltage on the floating gate after an erase operation and decoupling pass gates to provide increased charge difference between a programmed cell and an erased cell during a read operation.

BACKGROUND OF THE INVENTION

Co-pending and commonly-assigned U.S. patent application Ser. No. 11/183,198, filed on Jul. 15, 2005, by Pavel Poplevine et al., titled "Non-volatile Memory Cell with Improved Programming Technique" and which is the subject of a Notice of Allowance issued by the U.S. Patent Office on Nov. 2, 2006, discloses a 4-transistor PMOS non-volatile memory (NVM) cell that includes an embedded static random access memory (SRAM) cell. The NVM cell utilizes a reverse Fowler-Nordheim tunneling programming technique with very low programming current that allows an entire NVM cell array to be programmed at a single cycle. Application Ser. No. 11/183,198 is incorporated herein by reference to provide background information regarding the present invention.

Co-pending and commonly-assigned U.S. patent application Ser. No. 11/182,115, filed on Jul. 15, 2005, by Poplevine et al., titled "Reverse Fowler-Nordheim Tunneling Programming for Non-volatile Memory Cell," also discloses a low current programming method for a non-volatile memory (NVM) cell utilizing reverse Fowler-Nordheim tunneling. Application Ser. No. 11/182,115 is incorporated herein by reference to provide background information regarding the present invention.

Co-pending and commonly-assigned U.S. patent application Ser. No. 11/235,834, filed on Sep. 26, 2005, by Poplevine et al., titled "Method of Hot Electron Injection Programming of a Non-volatile Memory (NVM) Cell Array in a Single Cycle," discloses a 4-transistor non-volatile memory (NVM) cell that includes a static random access memory (SRAM) cell. The cell utilizes a hot electron injection programming technique which, in combination with the SRAM cell and a sequence of cascaded pass gates, allows an entire NVM cell array, or a selected row or sector of the array, to be programmed at a single cycle. Application Ser. No. 11/235,834 is incorporated herein by reference to provide background information regarding the present invention.

SUMMARY OF THE INVENTION

The present invention provides a 4-transistor non-volatile memory (NVM) cell that includes a static random access memory (SRAM) cell. The NVM cell utilizes a reverse Fowler-Nordheim tunneling programming technique that, in combination with the SRAM cell structure, allows an entire cell array to be programmed at one cycle. Equalize transistors are utilized to obtain more uniform voltage on the floating gate after an erase operation. Utilization of decoupling pass gates during a read operation results in more charge difference on the floating gates of programmed and erased cells.

The features and advantages of the present invention will be more fully understood and appreciated upon review and consideration of the following detailed description of the invention and the accompanying drawings which set forth an illustrative embodiment of the invention.

DETAILED DESCRIPTION OF THE INVENTION

Figure 1:
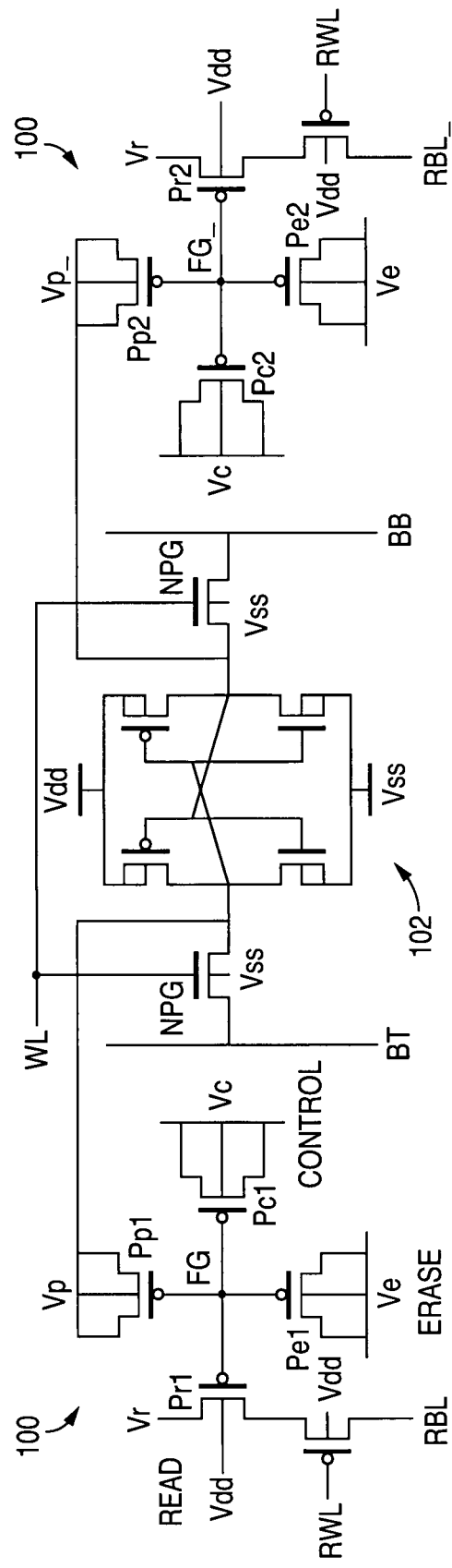
FIG. 1 is a schematic drawing illustrating a known dual 4-transistor NVM cell array with embedded SRAM.

FIG. 1 shows a known dual 4-transistor non-volatile (NVM) cell 100 with an embedded static random access memory (SRAM) cell structure 102. The floating gate voltage (FG & FG_) of the FIG. 1 cell is susceptible to coupling noise, particularly from those PMOS based capacitors Pp1, Pp2 that are connected to the embedded SRAM cell 102. As discussed in greater detail below, the present invention provides for decoupling any signals or noise from the SRAM structure 102 to the NVM cell 100 and for channeling the signal from the SRAM cell 102 to the NVM cell 100 during a program operation.

Figure 2A:
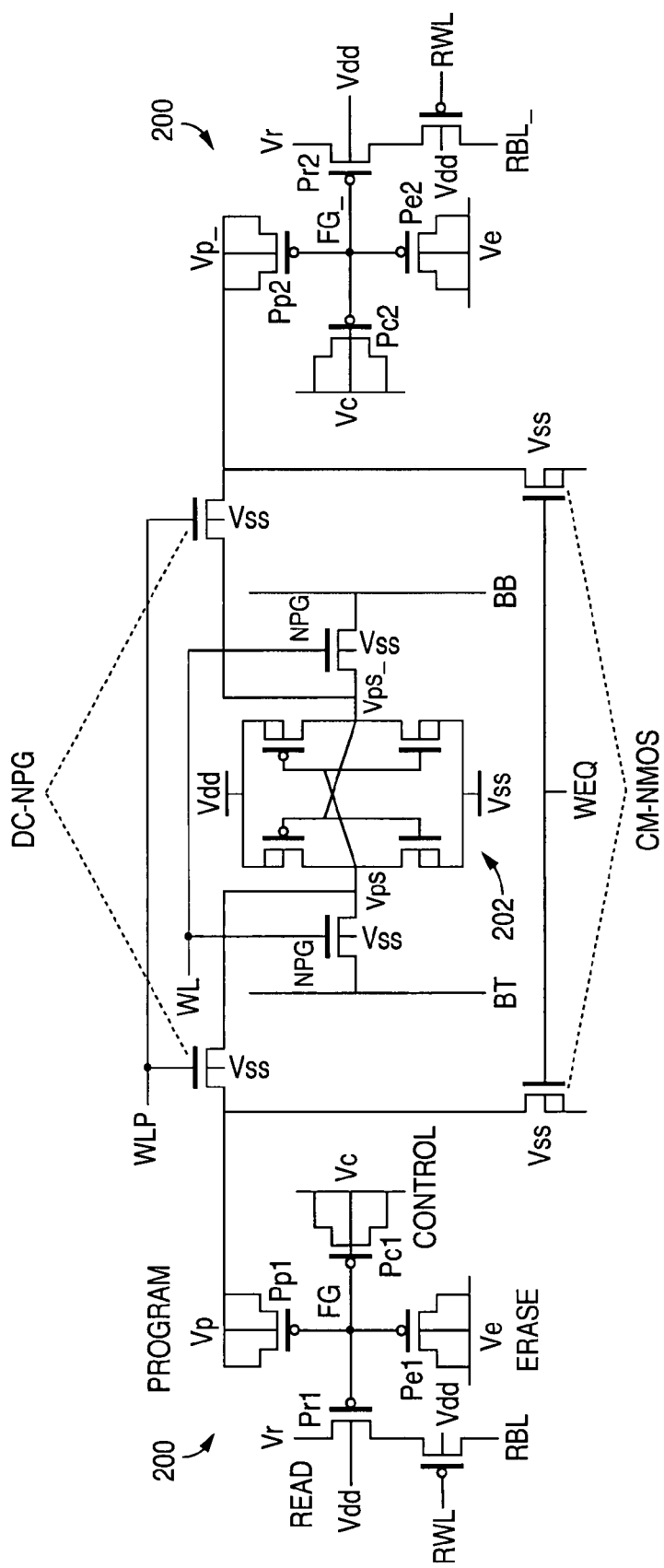
FIG. 2A is a schematic drawing illustrating a dual NVM cell with an SRAM cell, pass gates and equalize transistors in accordance with the present invention.

As shown in FIG. 2A, an embodiment of an NVM cell structure in accordance with the present invention is also based upon a dual 4 PMOS transistor NVM cell 200 that includes an embedded 6 transistor SRAM structure 202. In addition, the FIG. 2A NVM cell structure includes two decoupling N-channel pass-gates DC-NPG and two equalize N-channel devices CM-NMOS. Six PMOS based capacitors are formed by program devices Pp1, Pp2, control devices Pc1, Pc2, and erase devices Pe1, Pe2. However, coupling noise from control devices Pc1, Pc2 and erase devices Pe1, Pe2 are less significant than that from program devices Pp1, Pp2. This is due to the fact that the control voltage signal Vc and the erase voltage signal Ve are globally connected. Thus, any noise in devices Pc1, Pc2, Pe1, Pe2 will cause both floating gate voltage signal FG and floating gate voltage signal FG_ to shift in the same direction, i.e., the difference between the two voltage signals FG and FG_ remains the same. Devices Pc1, Pc2, Pe1, Pe2 are driven by voltage generators that are grounded or disabled whenever the cells are not in the program mode; therefore, devices Pc1, Pc2, Pe1, Pe2 have no net effect. As shown in FIG. 2A, program devices Pp1 and Pp2, on the other hand, are connected to the SRAM structure 202, which toggles frequently.

Referring back to FIG. 1, without the decoupling N-channel pass-gate structure, any signal change in the SRAM 102 will be coupled to floating gates FG and FG_ of the NVM cells 100 through devices Pp1 and Pp2, respectively. If the content of SRAM structure 102 after a programming operation is opposite the content during program mode, the delta current between the dual cell will be reduced and affect the data sensing. For instance, if the coupling ratio between device Pp1 and the remainder of the PMOS devices (Pc1, Pe1, Pr1) at ground is 1:10, then a −5V change in the programming voltage signal Vp from 5V to 0V will have a −0.5V change in the floating gate FG. The new floating gate voltage on floating gate FG will be FG−0.5V. A −5V change in the programming voltage signal Vp_ will change Vp_ from 0V to 5V. A 5V change in Vp_ will cause a +0.5V change in FG_. The new floating gate voltage on FG_ will be FG_+0.5V. The net delta voltage between FG and FG_ is reduced by 1V:FG-FG_−1V. The erased call will be more opened and conduct higher current. The program cell will become less opened and conduct less current. This could be disastrous if the delta between the two floating gates FG and FG_ is less than 1V. The sensed data will be flipped.

Referring back to FIG. 2A, in accordance with the invention, during an NVM read operation, the SRAM cell 202 is decoupled from the NVM cells 200 by setting WLP at the gates of the two pass gate devices DC-NPG to logic low. Under these conditions, any changes in the programming signal Vp and Vp_ will not affect FG and FG_, respectively. The equalize devices CM-NMOS are used to set up a common ground at the programming nodes Vp and Vp_ so that nodes Vp and Vp_ will not be floating during the read mode. This is done by setting equalize signal WEQ to the gates of equalize devices CM-NMOS to logic high and setting up a common ground at nodes Vp and Vp_. Thus, floating gate nodes FG and FG_ will be shifted down by the same amount. Data are read from the dual 4T NVM cells 200 by sensing voltage/current from the corresponding read bit lines RBL and RBL_. The sensed data can be written back into the SRAM cell 202 associated with the dual 4T cells 200. The memory data can now be accessed directly from the SRAM cell 202 rather than from the 4T cell 200. Accessing data from SRAM cell 202 is much faster than accessing it from 4T cell 200.

During program mode, the read voltage signal Vr and the erase voltage signal Ve are connected to voltage supply VDD to prevent the read devices Pr1, Pr2 and the erase devices Pe1, Pe2 from being programmed. VDD can be any voltage that is high enough to provide shielding against program, but low enough not to cause any disturb; a data one is passed to Vp/Vp_ via the corresponding pass gate DC-NPG. Since pass gate devices DC-NPG are NMOS transistors, the voltage level appearing on Vp/Vp_ is VDD-Vthn. The transmission is accomplished by setting signal WLP to logic high and signal WEQ to logic low.

Figure 2B:
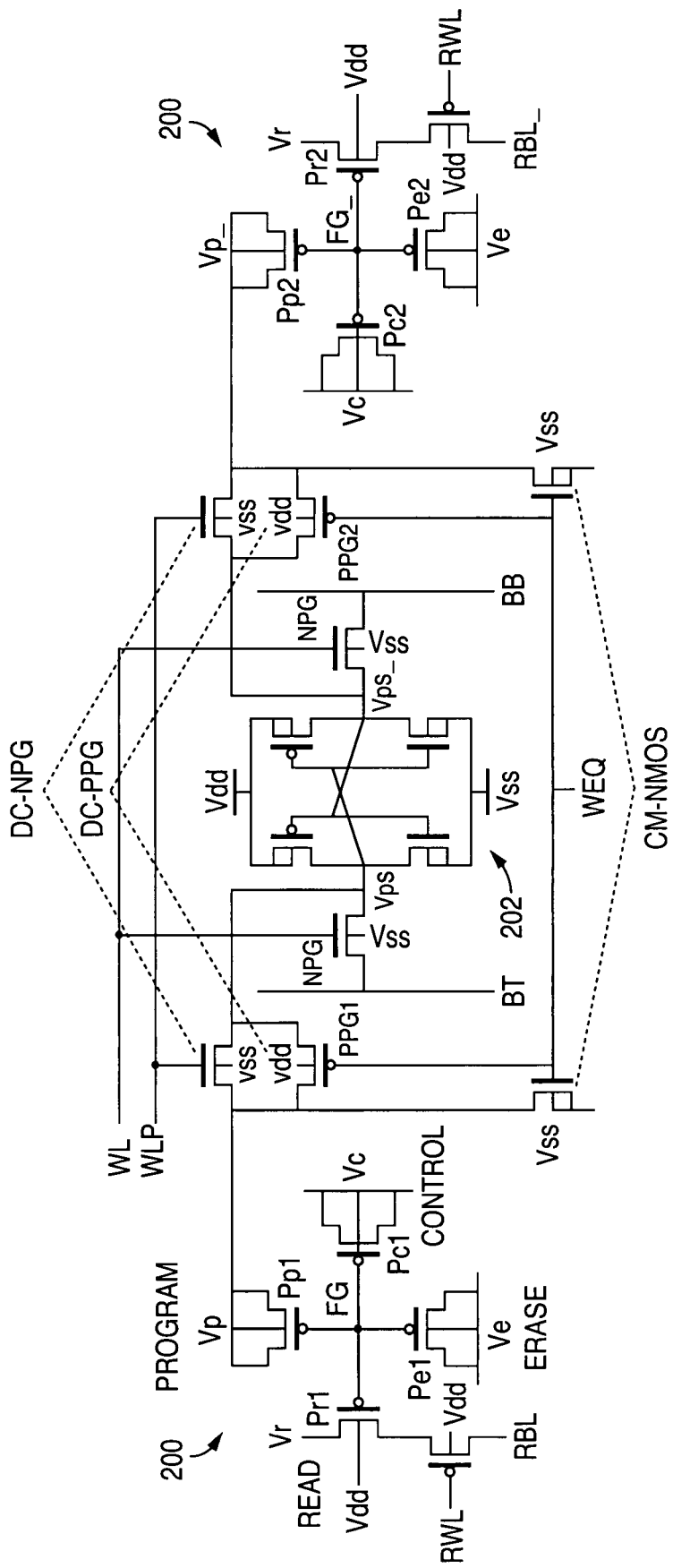
FIG. 2B is a schematic drawing illustrating a dual NVM cell with SRAM and full pass gate in accordance with the present invention.
Figure 2C:
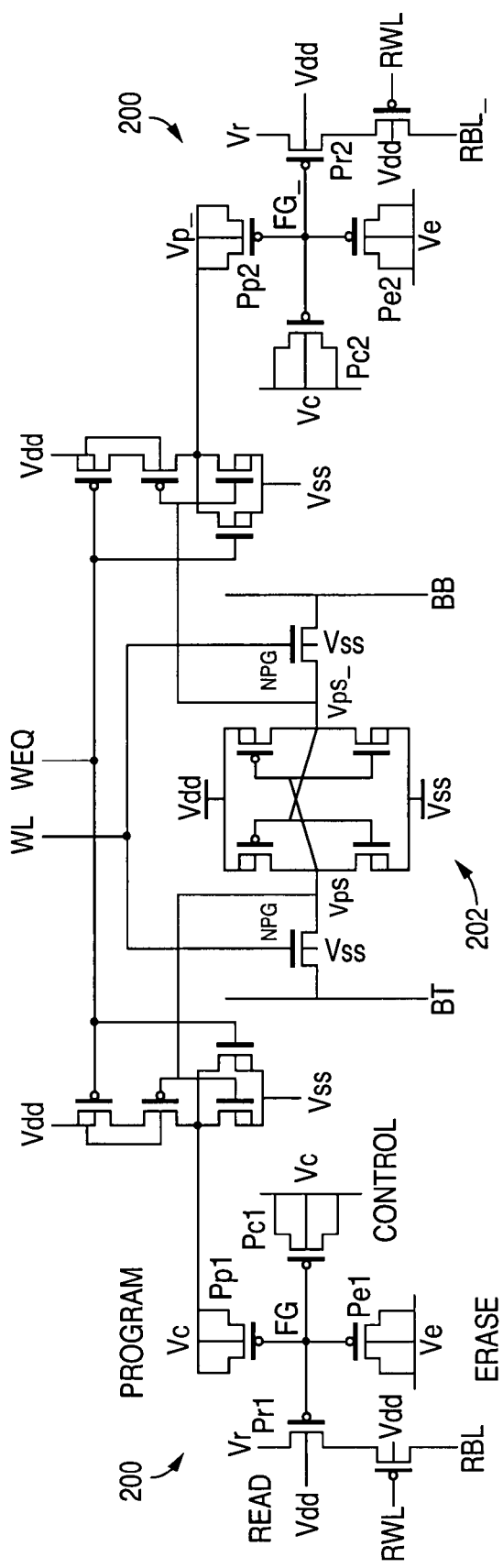
FIG. 2C is a schematic drawing illustrating a dual NVM cell with SRAM and NOR gate in accordance with the present invention.

To further enhance the cell by passing full VDD (on Vp/Vp_) to better inhibit the cell from program disturb, alternate embodiments of cell structures in accordance with the invention are provided, as shown in FIG. 2B and FIG. 2C. In the FIG. 2C embodiment, by the use of P-channel device P1, the signal WLP is not needed. The operation of the FIGS. 2B and 2C embodiments is identical to the operation of the FIG. 2A embodiment.

The control signal Vc, which, as stated above, is globally connected, is swept from 0V to $V_{cmax}$ in program time Tprog and stays at $V_{cmax}$ for another Tprog period. The preferred program time Tprog is around 50 ms-100 ms, which affects the amount of charge tunneling to the floating gates. $V_{cmax}$ depends on the tunneling threshold; electrons tunnel from the drain/source of the program (whichever device Pp1 or Pp2 that is at ground) transistor to the floating gate, making the gate more negative. At the end of the program cycle, control signal Vc is ramped down to 0 v. The floating gates will be left with a net negative charge from the reverse Fowler-Nordheim tunneling program.

During erase mode, signals RWL and WEQ are at logic high while signal WLP is at logic low. The rest of signals are grounded. The erase signal Ve is applied (~10V for 70 Å). Erase affects all cells. Those skilled in the art will appreciate that the erase signal Ve varies from technology to technology.

Signal WLP is set to high and signal WEQ set to low only during the program mode. For all other operations, signal WLP is always low and signal WEQ is always high. The SRAM 202 is always decoupled from the NVM cells 200, except during program mode.

Figure 3:
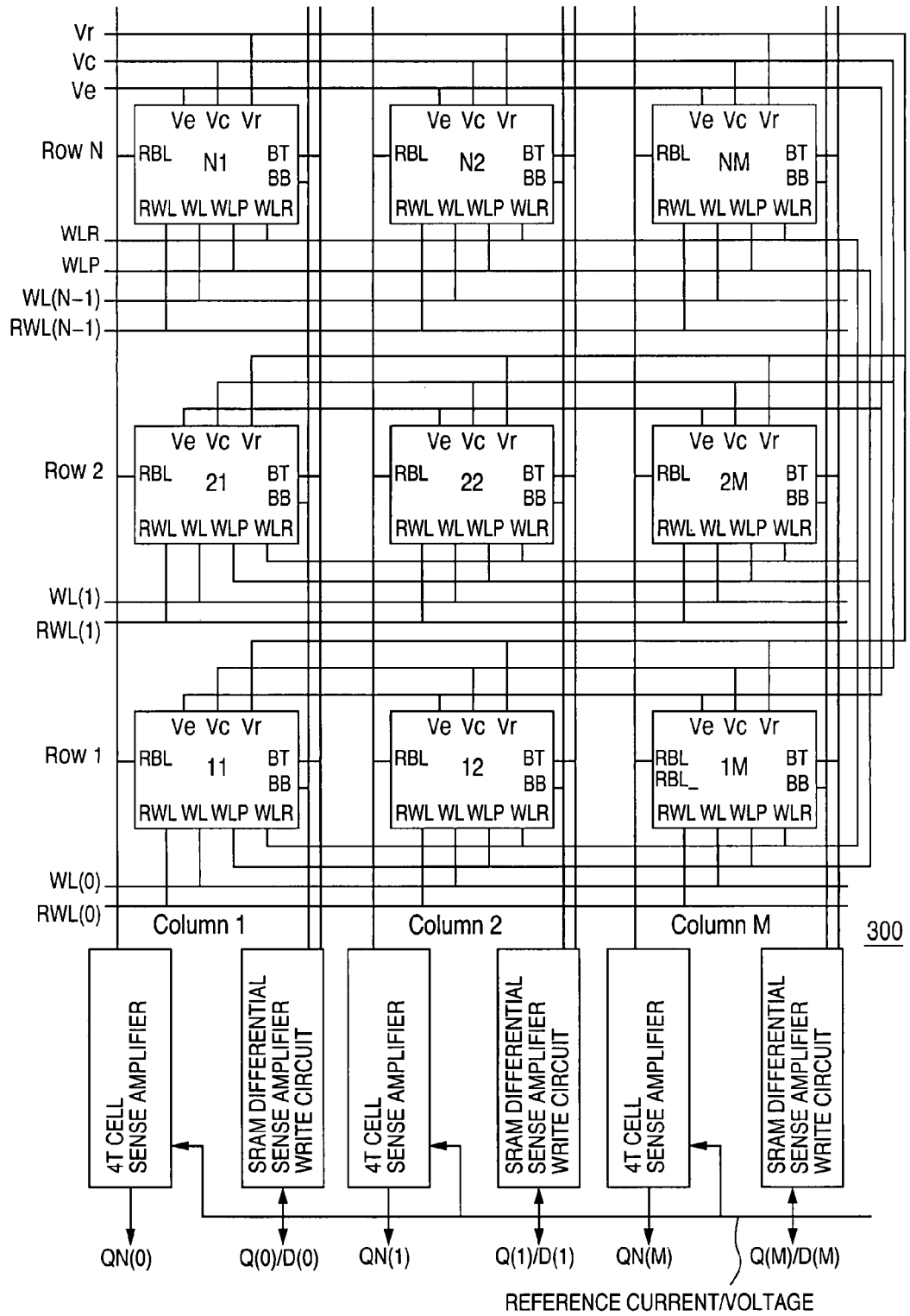
FIG. 3 is a schematic drawing of an array implementation of the NVM cell structure of FIG. 2A, FIG. 2B, or FIG. 2C, in accordance with the present invention.

FIG. 3 shows the implementation of a cell array 300 using cell structures as shown in FIG. 2A, FIG. 2B, or FIG. 2C. The array 300 has N rows and M columns. The SRAM word line (WL) selects a row to be written or read from the SRAM cell. The NVM Read word line (RWL) selects a row to be read from the dual 4T NVM cell. The erase voltage (Ve), the control voltage (Vc) and the read voltage (Vr) are applied to all cells in the array 300 directly without any high voltage switches or other supporting circuitry, thereby significantly simplifying connection from external or internal power sources. Signals WLP and WEQ are used to decouple the SRAM structure from the NVM cells during read and to couple the SRAM to NVM cell during program, as discussed above.

The following is a description of the Erase, Program and Read modes pertaining to the FIG. 3 array 300.

Erase Mode

In the erase mode, signals RWL(0) . . . RWL(N−1), WEQ are logic high, the erase voltage Ve is applied ((~10V for 70 Å, ~16V for 120 Å), and the rest of signals, including WLP, are grounded. Erase affects all cells. The erase voltage Ve varies from technology to technology.

Program Mode (1) SRAM write mode: Signals RWL(0) . . . RWL(N−1) are logic high. One of the SRAM word lines (WL), e.g., WL(0), should be logic high, the rest of the word lines WL, WL(1) . . . WL(N−1) should be logic low. Signal WLP is set to logic low and signal WEQ is set to logic high to decouple the SRAM structure. To write a zero (program) to the SRAM cell, the corresponding write bit line, e.g., BT(0), should be logic low and write bit line BB(0) at logic high. To write a one (remain erased) to the SRAM cell, the corresponding write bit line, e.g., (BB(0), should be logic low and write bit line BT(0) at logic high. The number of write cycles depends upon the number of rows (N) and the number of columns (M) in the array 300.

(2) Dual 4T cell program mode: Prior to program mode, the SRAM array is preloaded with data as described in (1) above and the NVM array is preconditioned in erase cycle. Signal WLP is set to logic high and signal WEQ is at logic low. Read word lines RWL(0) . . . RWL(N−1) are logic high. WL(0) . . . WL(N−1) are logic low. The written SRAM cell provides the logic to program the 4T NVM cell. Control voltage Vc is swept from 0 v to $V_{cmax}$. $V_{cmax}$ should be larger than the tunneling condition and depends on technology. The control voltage Vc timing sequence is the same as described above. Only one cycle is needed.

NVM Read Mode (1) Dual 4T NVM read mode followed by SRAM write mode: This step is to load the NVM content to the SRAM for faster access. One of the NVM read word lines (RWL), say RWL(0) should be at logic low, the rest of the read word lines RWL, RWL(1)...RWL-1) should be logic high. Signal WLP is set to logic low and signal WEQ is set to logic high to decouple the SRAM from NVM cell. All read bit lines (RBL(0)...(RBLM-1) or RBL-(0)...RBL_(M-1)) will be sensed using a BT cell sense amplifier by comparing the current/voltage between lines RBL and RBL_. At the SRAM write cycle, as described in (2), these sensed data are written to the SRAM cell through D(0)...D(M) and latched to output as QN(0)...QN(M).

(2) SRAM write mode: One of the SRAM word lines (WL), say WL(0) should be logic high, the rest of the word lines WL, WL(1)...WL(N−1) should be logic low. Signal WLP is set to logic low and signal WEQ is set to logic high. The rest of the signals are grounded. The NVM dual 4T cell read cycle and the SRAM write mode alternate until all columns and rows are cycled through. Accessing data from the SRAM cell is much faster than accessing from the NVM 4T cell.

SRAM Read

SRAM read mode: Read word lines=RWL(0)...RWL(N−1) are logic high. One of the SRAM word line (WL), e.g., WL(0), should be logic high, the rest of word lines WL, WL(1)...WL(N−1) should be logic low. Signal WLP is set to logic low and signal WEQ is set to logic high. If the cell was written zero, then bit line BB will be discharged to ground. These bit lines are sensed using the SRAM differential sense amplifiers and latched to the output.

Figure 4:
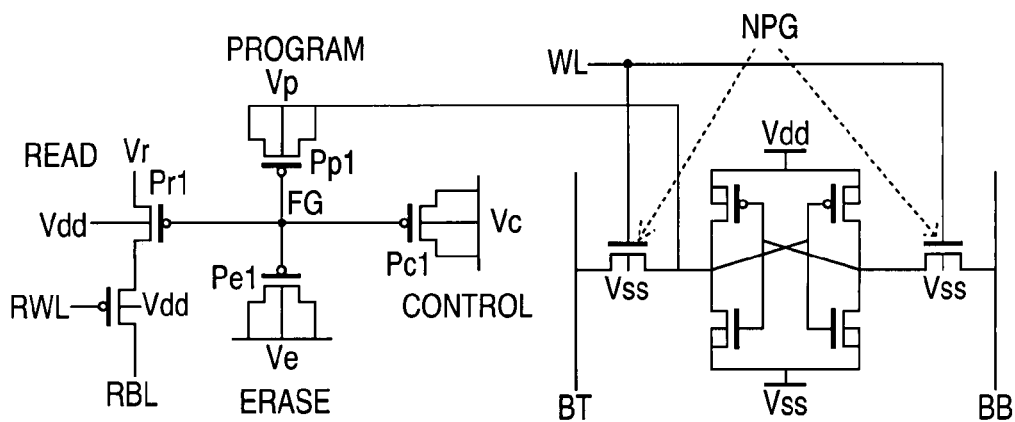
FIG. 4 is a schematic drawing illustrating a single NVM cell with SRAM in accordance with the present invention.

The decoupling technique described above is also applicable to the single NVM cell approach. The single NVM structure includes an NVM cell 400 and an embedded SRAM cell 402, as shown in FIG. 4. With the addition of the pass gates DC-NPG and equalize devices CM-CMOS, the new cell, shown in FIG. 5A, will have the same decoupling capability. To further enhance the cell by passing full VDD (on Vp/Vp_) to better inhibit the cell from program disturb, a variation of single NVM cell embodiments are disclosed in FIG. 5B and FIG. 5C. In the FIG. 5C embodiment, by the use of P-channel device P2, the signal WLP is not needed. The operation of signal WEQ is identical to FIG. 5A.

Figure 5A:
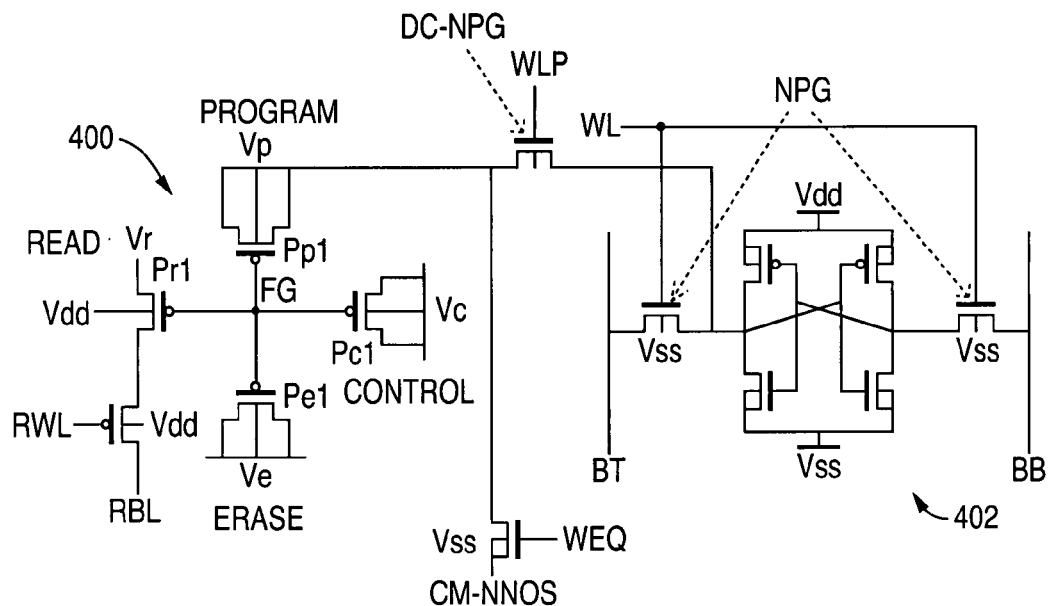
FIG. 5A is a schematic drawing illustrating a single NVM cell with an SRAM cell, pass gates and equalize transistors in accordance with the present invention.
Figure 5B:
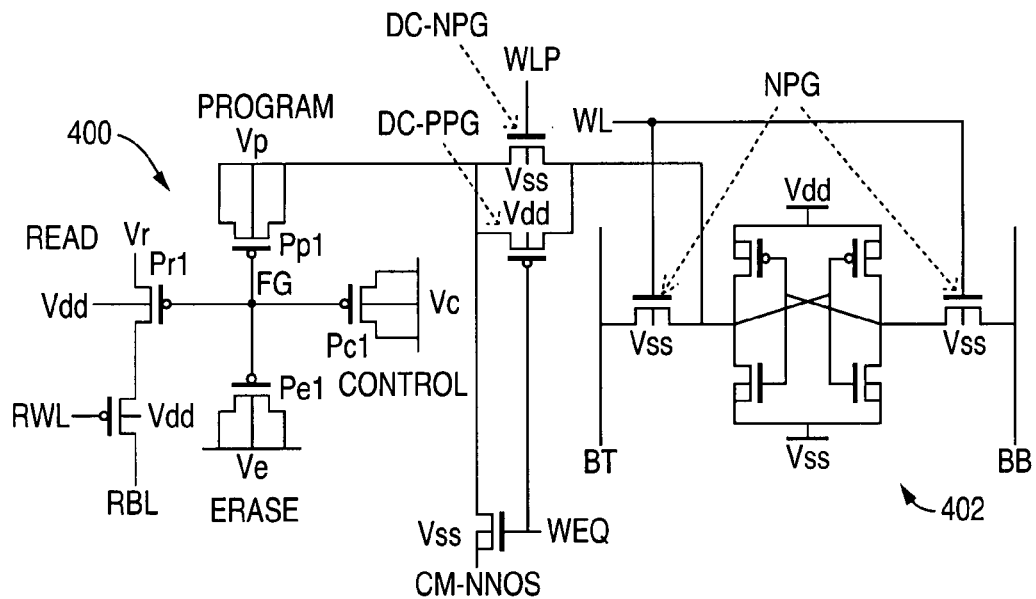
FIG. 5B is a schematic drawing illustrating a single NVM cell with SRAM and full pass gate in accordance with the present invention.
Figure 5C:
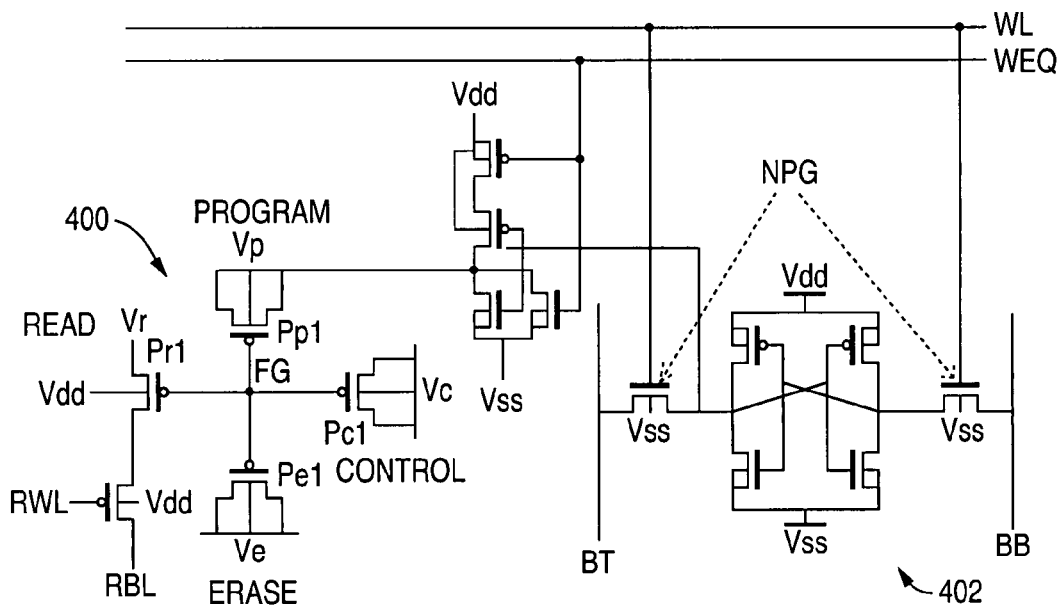
FIG. 5C is a schematic drawing illustrating a single NVM cell with SRAM and NOR gate in accordance with the present invention.
Figure 6:
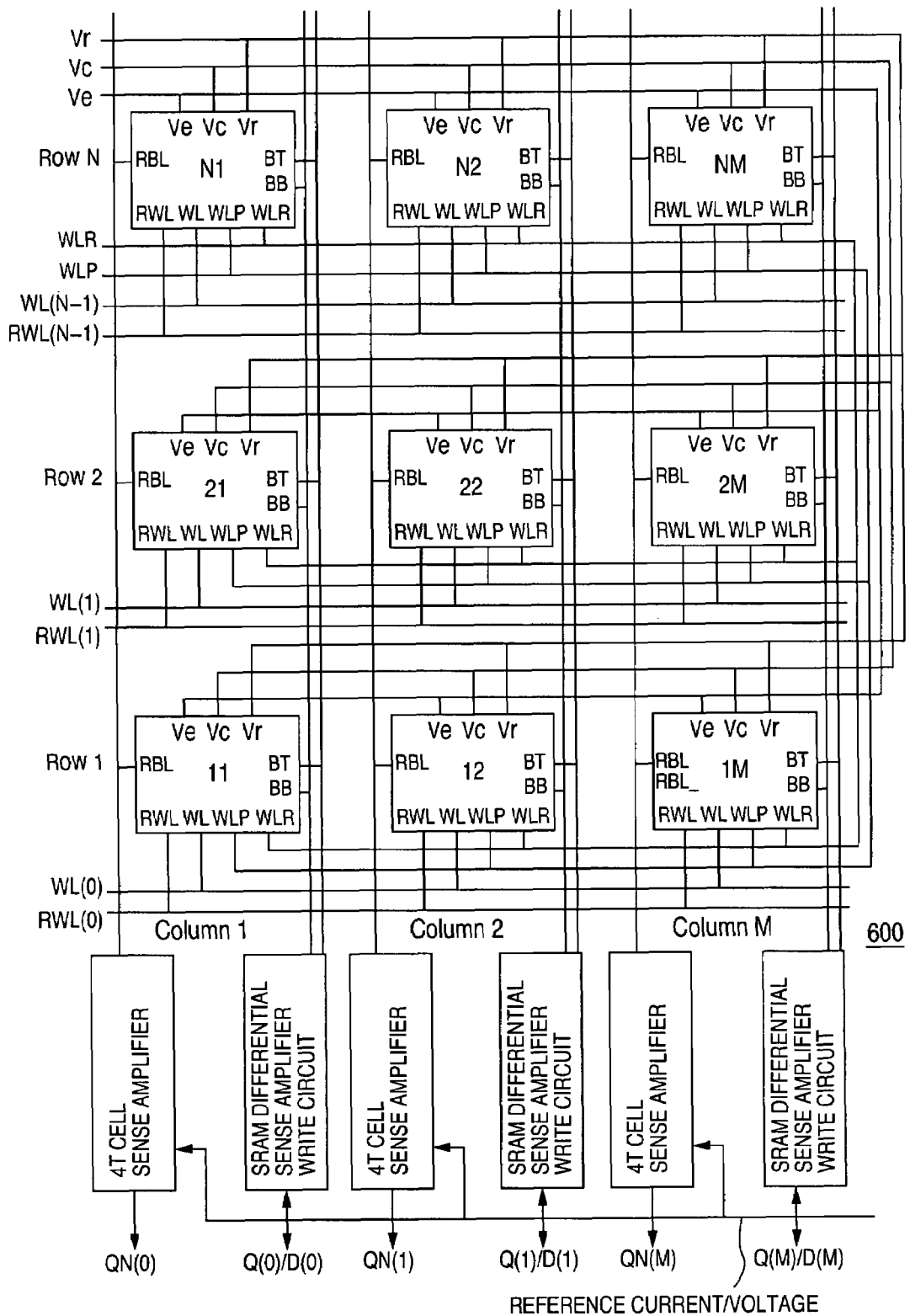
FIG. 6 is a schematic drawing illustrating an array implementation of the NVM cell of FIG. 5A, FIG. 5B, or FIG. 5C, in accordance with the present invention.

FIG. 6 shows an implementation of an array 600 using cell structures as shown in FIG. 5A, FIG. 5B, or FIG. 5C. The Erase, Program, Read modes for the FIG. 6 array 600 are the same as described above for the FIG. 3 array 300.

The advantage of the proposed enhancements is to reduce disturb that is caused by the direct coupling of SRAM to the NVM cell. The introduction of decoupling pass gates and equalize pass gates decouples the SRAM from the NVM cell and creates common ground for the NVM cell during read mode. The floating gate will not be affected by any change in the SRAM content and current/voltage sensing will be more robust.

Although only specific embodiments of the present invention are shown and described herein, the invention is not to be limited by these embodiments. Rather, the scope of the invention is to be defined by these descriptions taken together with the attached claims and their equivalents.

What is claimed is:

1. A non-volatile memory (NVM) cell structure comprising:
   a first NVM cell;
   a second NVM cell;
   a static random access memory (SRAM) cell;
   a first pass gate structure connected between the first NVM cell and the SRAM cell, the first pass gate structure being responsive to a first and second states of a pass gate signal to respectively couple and decouple the first NVM cell and the SRAM cell;
   a second pass gate structure connected between the second NVM cell and the SRAM cell, the second pass gate device being responsive to the first and second states of the pass gate signal to respectively couple and decouple the second NVM cell and the SRAM cell;
   a first equalize structure connected between the first pass gate structure and the first NVM cell and responsive to an equalize signal to connect the first NVM cell to a ground;
   a second equalize structure connected between the second pass gate structure and the second NVM cell and responsive to the equalize signal to connect the second NVM cell to ground, and wherein each of the first and second NVM cells comprises:
   a P-IGFET programming transistor having a gate electrode connected to a common floating gate node;
   a P-IGFET read transistor having a gate electrode connected to the common floating gate node;
   a P-IGFET erase transistor having a gate electrode connected to the common floating gate node; and
   a fourth P-IGFET control transistor having a gate electrode connected to the common floating gate node,
   wherein the first pass gate structure is connected between the P-IGFET programming transistor of the first NVM cell and a first data node of the SRAM cell.

2. A NVM cell structure as in claim 1, and wherein the second pass gate structure is connected between the P-IGFET programming transistor of the second NVM cell and a second data node of the SRAM cell.

3. A NVM cell structure as in claim 2, and wherein the first equalize structure comprises an first equalize NMOS transistor that includes first and second spaced apart diffusion regions defining a channel region therebetween and a gate electrode formed over the channel region, the first diffusion region being connected between the first pass gate device and the first NVM cell, the second diffusion region being connected to ground, and the gate electrode being connected to receive the equalize signal.

4. A NVM cell structure as in claim 3, and wherein the second equalize structure comprises a second NMOS transistor that includes first and second spaced apart diffusion regions defining a channel region therebetween and a gate electrode formed over the channel region, the first diffusion region being connected between the second pass gate device and the first NVM cell, the second diffusion region being connected to ground, and the gate electrode being connected to receive the equalize signal.

5. A NVM cell structure as in claim 1, and wherein the first pass gate structure includes a first pass gate NMOS transistor that includes first and second spaced apart diffusion regions defining a channel region therebetween and a gate electrode formed over the channel region, the first diffusion region being connected to the P-IGFET programming transistor of the first NVM cell, the second diffusion region being connected to a first data node of the SRAM cell, and the gate electrode being connected to receive the pass gate signal.

6. A NVM cell structure as in claim 5, and wherein the second pass gate structure further includes a second pass gate NMOS transistor that includes first and second spaced part diffusion regions defining a channel region therebetween and a gate electrode formed over the channel region, the first diffusion region being connected to the P-IGFET programming transistor of the second NVM cell, the second diffusion region being connected to a second data node of the SRAM cell, and the gate electrode being connected to receive the pass gate signal.

7. A NVM cell structure as in claim 6, and wherein the first pass gate structure further includes a first pass gate PMOS transistor that includes first and second spaced apart diffusion regions defining a channel region therebetween and a gate electrode formed over the channel region, the first diffusion region being connected to the P-IGFET programming transistor of the first NVM cell, the second diffusion region being connected to the first data node of the SRAM cell, and the gate electrode being connected to receive the equalize signal.

8. A NVM cell structure as in claim 7, and wherein the second pass gate structure further includes a second PMOS pass gate transistor that includes first and second spaced apart diffusion regions defining a channel region therebetween and gate electrode formed over the channel region, the first diffusion region being connected to the P-IGFET programming transistor of the second NVM cell, the second diffusion region being connected to the second data node of the SRAM cell, and the gate electrode being connected to receive the equalize signal.

9. A NVM cell structure comprising:

first and second NVM cells, each of the first and second NVM cells including a P-IGFET programming transistor having a gate electrode connected to a common floating gate node, a P-IGFET read transistor having a gate electrode connected to the common floating gate node, a P-IGFET erase transistor having a gate electrode connected to the common floating gate node, and a P-IGFET programming transistor having a gate electrode connected to the common floating gate node;

a SRAM cell;

a first equalize structure connected between the first NVM cell and the SRAM cell and responsive to an equalize signal to connect the first NVM cell to ground;

a second equalize structure connected between the second NVM cell and the SRAM cell and responsive to the equalize signal to connect the second NVM cell to ground; and wherein each of the first and second equalize structures includes a first NMOS transistor connected to first PMOS transistor, the gate electrodes of the first NMOS transistor and the first PMOS transistor being commonly connected to a data node of the SRAM cell, the second PMOS transistor being connected to the first PMOS transistor and having a gate electrode connected to receive the equalize signal, and a second NMOS transistor connected to the first NMOS transistor and having a gate electrode connected to receive the equalize signal.

* * * * *